United States Patent [19]
Claisse et al.

[11] Patent Number: 5,963,576
[45] Date of Patent: Oct. 5, 1999

[54] ANNULAR WAVEGUIDE VERTICAL CAVITY SURFACE EMITTING LASER AND METHOD OF FABRICATION

[75] Inventors: Paul Claisse, Gilbert; Wenbin Jiang, Phoenix; Philip Kiely, Gilbert, all of Ariz.

[73] Assignee: Motorola, Inc., Schaumburg, Ill.

[21] Appl. No.: 08/905,339

[22] Filed: Aug. 4, 1997

[51] Int. Cl.[6] .................................. H01S 3/08; H01S 3/19
[52] U.S. Cl. .................................. 372/96; 372/45
[58] Field of Search .................................. 372/45, 46, 50, 372/99, 96; 257/99; 438/22

[56] References Cited

U.S. PATENT DOCUMENTS

| | | | |
|---|---|---|---|
| 5,696,389 | 12/1997 | Ishikawa et al. | 372/50 |
| 5,703,892 | 12/1997 | Claisse et al. | 372/96 |
| 5,719,891 | 2/1998 | Jewell | 372/45 |
| 5,748,661 | 5/1998 | Keily et al. | 372/50 |
| 5,757,836 | 5/1998 | Jiang et al. | 372/50 |
| 5,799,030 | 8/1998 | Brenner | 372/50 |

*Primary Examiner*—Rodney Bovernick
*Assistant Examiner*—Quyen Phan Leung
*Attorney, Agent, or Firm*—Eugene A. Parsons; William E. Koch

[57] ABSTRACT

An annular waveguide VCSEL for achieving a stable high power single high order mode output including a first mirror stack with mirror pairs in a $Al_xGa_{1-x}As/Al_yGa_{1-y}As$ material system lattice matched to an active region. The active region includes an active structure sandwiched between a first cladding region adjacent the first mirror stack and a second cladding region, the active structure having at least one quantum well. The VCSEL further includes a second mirror stack lattice matched to the second cladding region and having mirror pairs in a $Al_xGa_{1-x}As/Al_yGa_{1-y}As$ material system. The second mirror stack including an etched region, thereby defining an annular emission region through which light generated by the annular waveguide VCSEL is emitted.

19 Claims, 2 Drawing Sheets

-PRIOR ART-

-PRIOR ART-

ANNULAR WAVEGUIDE VERTICAL CAVITY SURFACE EMITTING LASER AND METHOD OF FABRICATION

FIELD OF THE INVENTION

This invention relates to vertical cavity surface emitting lasers and more specifically to vertical cavity surface emitting lasers for single high order mode operation.

BACKGROUND OF THE INVENTION

In the past few years there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

However, even with these advances in deposition techniques there is difficulty during manufacturing in controlling the mode of operation of the laser while maintaining high output power. VCSELs are formed by depositing a plurality of layers on a substrate to form the VCSEL. See, for example, U.S. Pat. No. 5,034,092, entitled "PLASMA ETCHING OF SEMICONDUCTOR SUBSTRATES", issued Jul. 23, 1991, assigned to the same assignee and included herein by this reference, and U.S. Pat. No. 5,256,596, entitled "TOP EMITTING VCSEL WITH IMPLANT", issued Oct. 26, 1993, assigned to the same assignee and included herein by this reference.

VCSELs generally include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs/GaAs or AlGaAs/AlAs material system wherein the different refractive index of each layer of a pair is achieved by altering the aluminum content in the layers. In conventional devices, the number of mirror pairs per stack may range from 20 to 40 to achieve a high percentages of reflectivity, depending on the difference between the refractive indices of the layers. The large number of pairs increases the percentage of reflected light.

In conventional VCSELs, conventional material systems perform adequately. However, new products are being developed requiring VCSELs to operate in a stable high order mode of operation. These types of VCSELs are of great interest in the optical telecommunication and optical data storage industries. Typically it is difficult to achieve a stable single high order mode output from a multi mode VCSEL. Traditionally, single mode output VCSELs have been achieved by shrinking the VCSEL device size to force laser operation in the fundamental/lowest order mode of operation. As a result, the small device size operates to have a low output power.

It would be highly advantageous, therefore, to remedy the foregoing and other deficiencies inherent in the prior art.

Accordingly, it is an object of the present invention to provide a new and improved stable high power single high order mode VCSEL fabricated as a annular waveguide VCSEL.

Another object of the invention is to provide a reliable high power single high order mode VCSEL.

Yet another object of the invention is to reduce the complexity of fabricating a high power single high order mode VCSEL.

Another object of the present invention is to provide for a method of fabricating an annular waveguide VCSEL that includes the etching of a second mirror stack so as to force the lasing mode to be confined to an annular region thereby forcing the VCSEL to operate in a single high order mode.

SUMMARY OF THE INVENTION

Briefly, to achieve the desired objects of the instant invention in accordance with a preferred embodiment thereof, provided is an annular waveguide VCSEL for operating in a high power single high order mode. The VCSEL includes a first mirror stack, an active region with at least one quantum well, the active region being disposed on the first mirror stack, and a second mirror stack disposed on the active region. The second mirror stack is etched to provide for an annular waveguide, thereby emitting light in a high power single high order mode.

In a preferred embodiment the active region and the first and the second mirror stacks are configured to emit light with a wavelength in a range of approximately 770–790 nm. The quantum well is configured with a direct energy bandgap in a range of approximately 1.57–1.61 eV and includes AlGaAs.

Also provided is a method of fabricating a VCSEL for operating in a high power single high order mode. The method includes providing a substrate having a surface, epitaxially growing a first mirror stack on the surface, epitaxially growing an active region with at least one quantum well on the first mirror stack, epitaxially growing a second mirror stack on the active region and etching down through the second mirror stack to form an annular waveguide.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
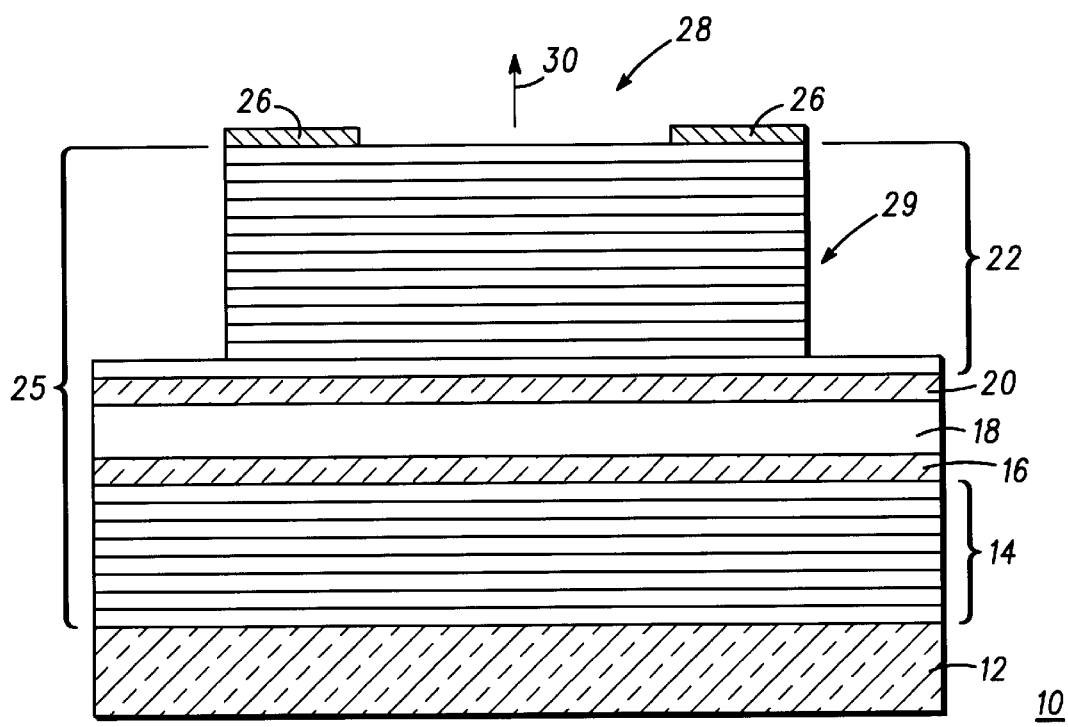
FIG. 1 is a sectional view of a typical prior art VCSEL.
Figure 2:
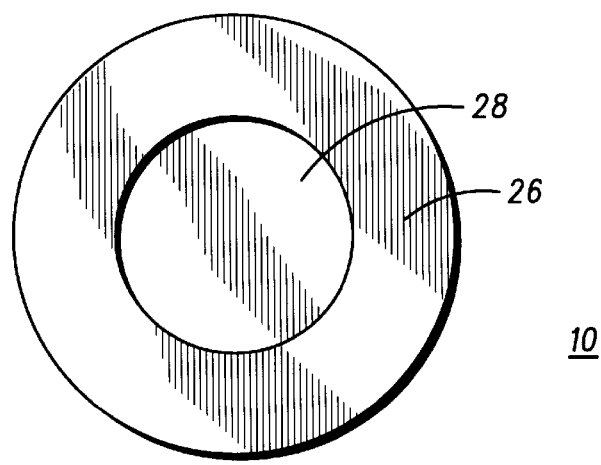
FIG. 2 is a top view of the field emission of the prior art VCSEL of FIG. 1.

Turning now to the drawings in which like reference characters indicate corresponding elements throughout the several views, attention is first directed to FIG. 1 which illustrates a typical ridge waveguide VCSEL 10 identified as prior art. As illustrated, VCSEL 10 is formed of a plurality of epitaxial layers, generally designated 25, fabricated on a substrate 12. Epitaxial layers 25 include a first mirror stack 14 formed on substrate 12, a first cladding region 16 formed on first mirror stack 14, an active region 18 formed on first cladding region 16, a second cladding region 20 formed on active region 18, and a second mirror stack 22 formed on second cladding region 20. The plurality of epitaxial layers 25, are etched to form a mesa, or ridge-like structure 29, capable of emitting light of a specific wavelength. There is fabricated on an uppermost surface of second mirror stack 22 an electrical contact layer 26. Electrical contact layer 26 defines a laser emission aperture 28 for light 30 emitted by VCSEL 10. Illustrated in FIG. 2 is a view of the prior art VCSEL 10 of FIG. 1, in top plan, further showing the laser emission aperture 28 defined by contact layer 26.

Figure 3:
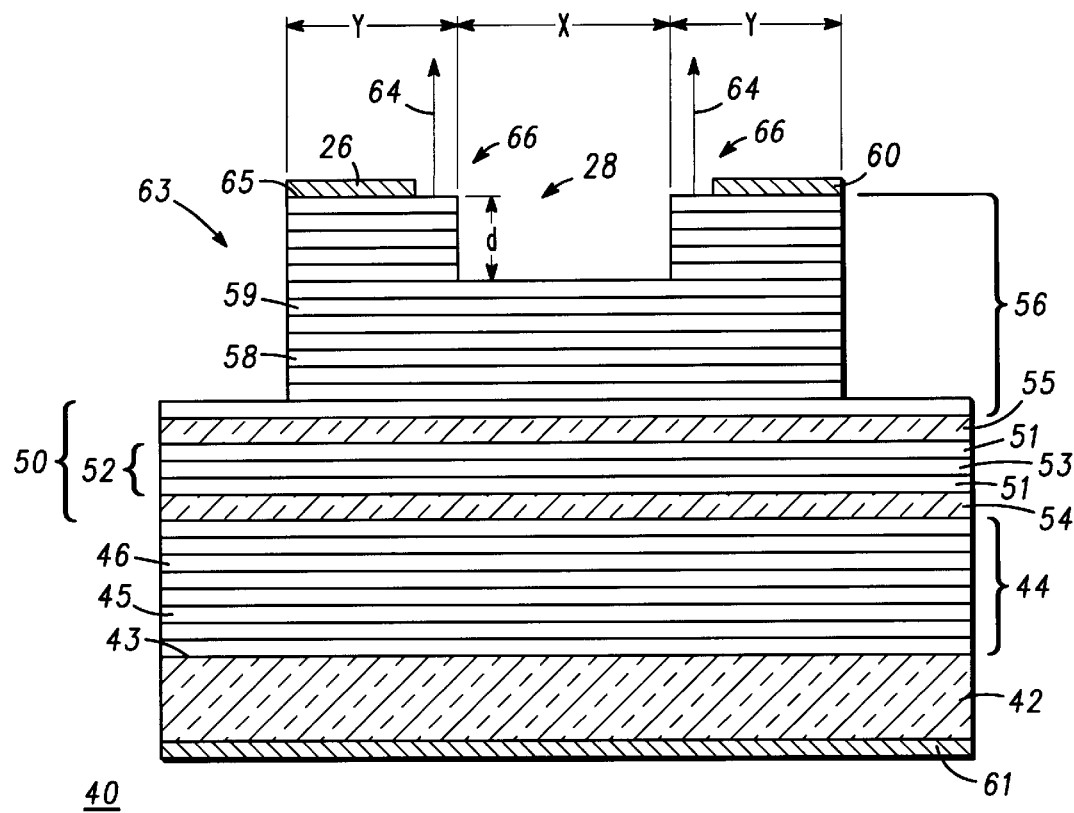
FIG. 3 is a sectional view of a annular waveguide VCSEL according to the present invention.

Referring now to FIG. 3, illustrated in simplified sectional view is an annular waveguide VCSEL 40 according to the present invention. Annular waveguide VCSEL 40 is generally fabricated similar to prior art ridge waveguide VCSEL 10 of FIGS. 1 and 2. More specifically, annular waveguide VCSEL 40 includes a substrate 42, which in this specific embodiment, is GaAs. GaAs is preferably used to facilitate epitaxial growth of the components of VCSEL 40 which operates in a stable single high order mode, having a wavelength of approximately in the range of 770–790 nm. It should be understood that GaAs is only utilized as an example and other semiconductor materials may be employed as substrate 42.

Substrate 42 has an upper surface 43 on which a first mirror stack 44 is disposed. First mirror stack 44 includes a plurality of mirror pairs 45 and 46 in a n-doped $Al_xGa_{1-x}As/Al_yGa_{1-y}As$ material system. An active region 50 is disposed on first mirror stack 44. Active region 50 includes an active structure 52 in an AlGaAs material system, sandwiched between a n-doped first cladding region 54, adjacent first mirror stack 44, and a p-doped second cladding region 55. A second mirror stack 56 is disposed on second cladding region 55 and includes mirror pairs 58 and 59 in a p-doped $Al_xGa_{1-x}As/Al_yGa_{1-y}As$ material system. Finally, a contact layer 60 is deposited on second mirror stack 56.

First mirror stack 44 is grown by epitaxially depositing pairs of layers 45 and 46 on substrate 42. In order to crystal lattice match mirror stack 44 to substrate 42 a suitable semiconductor material system must be deposited. In this specific example, substrate 42 is GaAs and, therefore, a $Al_xGa_{1-x}As/Al_yGa_{1-y}As$ material system is employed. Approximately 20 to 40 mirror pairs of this material system are deposited on substrate 42 depending on the difference between the refractive indices of the layers. The different refractive index of the layers of each pair is achieved by altering the aluminum content. In this specific embodiment, a $Al_{0.99}Ga_{0.01}As$ layer 45 and a $Al_{0.25}Ga_{0.75}As$ 46 layer forming a mirror pair is preferred. The large number of pairs increases the percentage of reflected light.

Cladding region 54 includes one or more layers which may be graded. In this specific embodiment, cladding region 54 is formed of a AlGaAs material system. For example cladding region 54 includes a first layer (not shown) formed of an n-doped AlGaAs with the Al mole fraction ranging from 40% to 50% and a second layer (not shown) formed of an undoped AlGaAs material having an Al mole fraction ranging from 30% to 40% for better carrier confinement of active structure 52.

Active structure 52, in this embodiment, includes three quantum well layers (not shown), separated by barrier layers (not shown). For example, the quantum well layers and the barrier layers are each approximately 100 Å and the total thickness of active region 50 is approximately one wavelength of the emitted light or a multiple thereof. One skilled in the art will understand that more or fewer quantum well layers and barrier layers can be used depending upon the application. Active region 50 and first and second mirror stacks 44 and 56 respectively are configured to emit light with a wavelength in a range of approximately 770–790 nm. To achieve this range the quantum wells are configured with a direct energy bandgap in a range of approximately 1.57–1.61 eV with x=0.12.

Cladding region 55 includes one or more layers which may be graded if necessary. In this specific embodiment, cladding region 55 is formed of a AlGaAs material system. For example cladding region 55 includes a first layer (not shown) formed of undoped AlGaAs with an Al mole fraction ranging from 30% to 40%, and a second layer (not shown) formed of a p-doped AlGaAs material having an Al mole fraction ranging from 40% to 60% for better carrier confinement.

Mirror stack 56 is grown by epitaxially depositing pairs of layers on cladding region 55. In order to crystal lattice match mirror stack 56 to active structure 52, a suitable semiconductor material system must be deposited. In this specific example, cladding region 55 is GaAs based and, therefore, a $Al_xGa_{1-x}As/Al_yGa_{1-y}As$ material system is employed. Approximately 20 to 40 mirror pairs of this material system are deposited on cladding region 55 depending on the difference between the refractive indices of the layers. The different refractive index the layers of each pair is achieved by altering the aluminum content. In this specific embodiment, a $Al_{0.99}Ga_{0.01}As$ layer 58 and a $Al_{0.25}Ga_{0.75}As$ 59 layer forming a mirror pair is preferred. The large number of pairs increases the percentage of reflected light.

To complete VCSEL 40, contact layer 60 is positioned on mirror stack 56, and a contact layer 61 is positioned on substrate 42, for example on the rear surface thereof. As will be understood by those skilled in the art, contact 60 is so constructed as to permit the emission of light from VCSEL 40.

Annular waveguide VCSEL 40 is fabricated by epitaxial growth of the plurality of layers of different compositions previously identified. Epitaxial deposition of the plurality of layers is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, silicon or the like. Fabrication of VCSEL devices typically use epitaxial deposition extensively to produce the multitude of layers of different materials which make up the device.

Once the deposition of the plurality of layers of different compositions is complete, annular waveguide VCSEL 40 undergoes a final step to form the complete device. More particularly, a portion of second mirror stack 56 is selectively removed, more particularly is selectively etched, to form a non-lasing area, or etched region 62. During the etching process, second mirror stack 56 is etched down from an uppermost surface 65, noted by "d" in FIG. 3, approximately 1.0–2.0 microns using one of a dry etch process or a wet etch process. It should be understood that that the depth of etching can be increased or decreased dependent upon the specific application for the laser device. This circular portion of the second mirror stack 56 that is moved has the effect of preventing the device from lasing in this etched region 62 due to insufficient reflectivity to support lasing. This in effect forces VCSEL 40 to operate in a single high order mode partially due to annular waveguiding. Accordingly, light 64 generated by VCSEL 40 is emitted in an annular emission region 66. The mode order that annular waveguide VCSEL 40 can support is adjustable by varying the diameter, "x", of etched region 62 relative to the mesa diameter, "y", of VCSEL 40.

Figure 4:
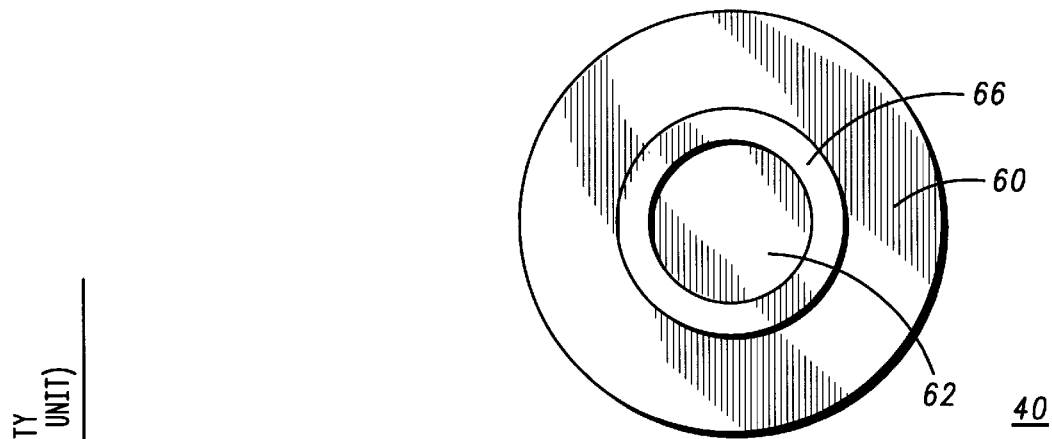
FIG. 4 is a top view of the field of emission of the annular waveguide VCSEL of FIG. 3 in accordance with the present invention.

Referring now to FIG. 4, illustrated is a top view of VCSEL 40 of FIG. 3. further illustrating contact layer 60, annular emission region 66, and etched region 62. It should be understood that throughout the drawings that while a single VCSEL structure is illustrated, there can be many of these structures located on substrate 42 to form arrays.

Figure 5:
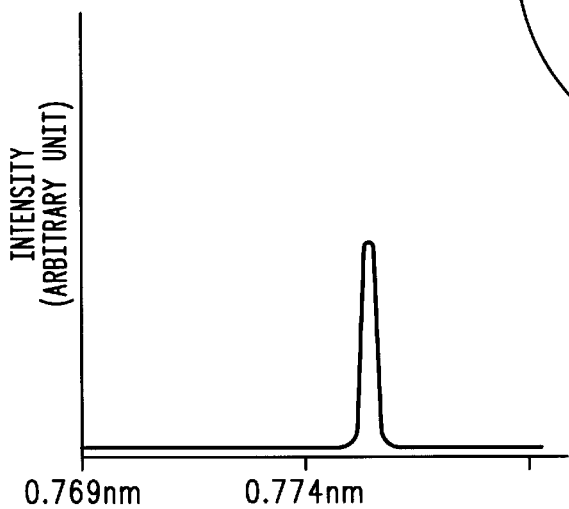
FIG. 5 is a graphical representation of the wavelength spectrum of the annular waveguide VCSEL of FIGS. 3 and 4 in accordance with the present invention.

A graphical representation of the intensity of light 64 generated by VCSEL 40 versus the corresponding wavelength is illustrated in FIG. 5. More particularly, illustrated is the wavelength spectrum of light generated by VCSEL 40. Typically, a multimode high order VCSEL will generate multiple wavelengths. VCSEL 40 of the present invention operates as an annular waveguide thereby operating to achieve a stable single mode high order output having a single wavelength. This type of VCSEL device capable of operating in a stable high order single mode can find applications in data storage when a phase shift mask is integrated to facilitate the beam focusing into a spot smaller than the Fourier transform limit of a Gaussian laser beam. Such a focused beam can be used for high density optical data storage. Further information regarding the incorporation and/or integrating of a phase shift mask with a VCSEL device can be found in pending U.S. patent applications, (i) Ser. No. 08/895,780, bearing attorney docket no. CR 97-069, entitled "A VERTICAL CAVITY SURFACE EMITTING LASER WITH PHASE SHIFT MASK", mailed on Jul. 17, 1997, assigned to the same assignee, and incorporated herein by this reference, and (ii) Ser. No. 08/895,781, bearing attorney docket no. CR 97-054, entitled "AN OPTICAL PICKUP HEAD FOR HIGH DENSITY OPTICAL DATA STORAGE APPLICATIONS", mailed on Jul. 17, 1997, assigned to the same assignee, and incorporated herein by this reference.

Various changes and modifications to the embodiments herein chosen for purposes of illustration will readily occur to those skilled in the art. For example, it should be understood that VCSEL structure symmetry exists for both the p and n dopents as well as electrically inverted structure designs. To the extent that such modifications and variations do not depart from the spirit of the invention, they are intended to be included within the scope thereof which is assessed only by a fair interpretation of the following claims.

What is claimed is:

1. An annular waveguide vertical cavity surface emitting laser comprising:
    a substrate element having a first surface and an oppositely opposed second surface;
    a first mirror stack formed on the first surface of the substrate element;
    an active region with a quantum well, the active region being disposed on the first mirror stack;
    a second mirror stack disposed on the active region, the second mirror stack including an etched region defining an annular emission region; and
    a first contact layer positioned on an uppermost surface of the second mirror stack constructed to permit the emission of light from the annular emission region and a second contact layer positioned on the oppositely opposed second surface of the substrate element.

2. An annular waveguide vertical cavity surface emitting laser as claimed in claim 1 wherein the first mirror stack, the active region and the second mirror stack operate in a stable single high order mode.

3. An annular waveguide vertical cavity surface emitting laser as claimed in claim 2 wherein the active region and the first and second mirror stacks are configured to emit light with a wavelength in a range of approximately 770–790 nm.

4. An annular waveguide vertical cavity surface emitting laser as claimed in claim 1 wherein the etched region is defined by etching down through the second mirror stack in a range of 1.0–2.0 microns.

5. An annular waveguide vertical cavity surface emitting laser as claimed in claim 4 wherein light emitted by the annular waveguide vertical cavity surface emitting laser is in a single wavelength spectrum.

6. An annular waveguide vertical cavity surface emitting laser as claimed in claim 5 wherein the vertical cavity surface emitting laser is etched to define a mesa having a defined diameter, and a mode order that the annular waveguide vertical cavity surface emitting laser supports is adjustable by varying a diameter of the etched region relative to the diameter of the defined mesa.

7. An annular waveguide vertical cavity surface emitting laser comprising:
    a substrate element having a first surface and an oppositely opposed second surface;
    a first mirror stack including mirror pairs in a $Al_xGa_{1-x}As/Al_yGa_{1-y}As$ material system;
    an active region including an active structure sandwiched between a first cladding region adjacent the first mirror stack and a second cladding region, the active structure having at least one quantum well;
    a second mirror stack disposed on the second cladding region and including mirror pairs in a $Al_xGa_{1-x}As/Al_yGa_{1-y}As$ material system, the second mirror stack including an etched region thereby confining a lasing mode of the annular waveguide vertical cavity surface emitting laser to an annular emission region; and
    a first contact layer positioned on an uppermost surface of the second mirror stack constructed to permit the emission of light from the annular emission region and a second contact layer positioned on the oppositely opposed second surface of the substrate element.

8. An annular waveguide vertical cavity surface emitting laser as claimed in claim 7 wherein the first mirror stack, the active region and the second mirror stack operate in a stable single high order mode.

9. An annular waveguide vertical cavity surface emitting laser as claimed in claim 8 wherein the first mirror stack, the active region and the second mirror stack are configured to emit light with a wavelength in a range of approximately 770–790 nm.

10. An annular waveguide vertical cavity surface emitting laser as claimed in claim 7 wherein the at least one quantum well is configured with a direct energy bandgap in a range of approximately 1.57–1.61 eV.

11. An annular waveguide vertical cavity surface emitting laser as claimed in claim 7 wherein the at least one quantum well includes AlGaAs.

12. A method of fabricating an annular waveguide vertical cavity surface emitting laser, the method comprising the steps of:
    providing a substrate having a first surface and an oppositely opposed second surface;
    epitaxially growing a first mirror stack on the first surface;

epitaxially growing an active region with a quantum well on the first mirror stack;

epitaxially growing a second mirror stack on the active region;

positioning a first contact layer on the second mirror stack constructed to permit an emission of light from the vertical cavity surface emitting laser, and positioning a second contact layer on the oppositely opposed second surface of the substrate; and selectively removing a portion of the second mirror stack to define a non-lasing region and an annular emission region where light generated by the first mirror stack, the active region and the second mirror stack is emitted.

13. A method of fabricating an annular waveguide vertical cavity surface emitting laser as claimed in claim 12 wherein the step of epitaxially growing an active region includes epitaxially growing the quantum well to include AlGaAs.

14. A method of fabricating an annular waveguide vertical cavity surface emitting laser as claimed in claim 13 wherein the step of selectively removing a portion of the second mirror stack includes a process of etching, thereby defining an etched region.

15. A method of fabricating an annular waveguide vertical cavity surface emitting laser as claimed in claim 14 wherein the process of etching includes at least one of a dry etch process and a wet etch process.

16. A method of fabricating an annular waveguide vertical cavity surface emitting laser as claimed in claim 14 wherein the process of etching the second mirror stack to define an etched region and an annular emission region includes etching down from an upper surface of the second mirror stack through a portion of the second mirror stack to a depth in a range of approximately 1.0–2.0 microns.

17. A method of fabricating an annular waveguide vertical cavity surface emitting laser, the method comprising the steps of:

providing a GaAs substrate having a surface;

epitaxially growing a first plurality of mirror pairs in a $Al_xGa_{1-x}As/Al_yGa_{1-y}As$ material system forming a first mirror stack on the surface, lattice matched to the GaAs substrate;

epitaxially growing an active region including an active structure sandwiched between a first cladding region lattice matched to the first mirror stack and a second cladding region, forming the active structure with a quantum well;

epitaxially growing a second plurality of mirror pairs in a $Al_xGa_{1-x}As/Al_yGa_{1-y}As$ material system forming a second mirror stack lattice matched to the second cladding region;

positioning a first contact layer on an uppermost surface of the second mirror stack constructed to permit an emission of light from the vertical cavity surface emitting laser and positioning a second contact layer on an oppositely opposed second surface of the substrate; and etching down from an upper surface of the second mirror stack, through a portion of the second mirror stack to define an etched region and an annular emission region.

18. A method of fabricating an annular waveguide vertical cavity surface emitting laser as claimed in claim 17 wherein the step of etching down from an upper surface of the second mirror stack, through a portion of the second mirror stack includes etching down to a depth in a range of approximately 1.0–2.0 microns.

19. A method of fabricating an annular waveguide vertical cavity surface emitting laser as claimed in claim 18 wherein the step of etching down from an upper surface of the second mirror stack, through a portion of the second mirror stack forces the annular waveguide vertical cavity surface emitting laser to operate so as to confine the lasing mode to the remaining annular emission region.

\* \* \* \* \*